(12) United States Patent
Shibata et al.

(10) Patent No.: US 12,142,644 B2
(45) Date of Patent: Nov. 12, 2024

(54) NITRIDE SEMICONDUCTOR DEVICE

(71) Applicant: PANASONIC HOLDINGS CORPORATION, Kadoma (JP)

(72) Inventors: Daisuke Shibata, Kyoto (JP); Satoshi Tamura, Osaka (JP); Nanako Hirashita, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 18/117,243

(22) Filed: Mar. 3, 2023

(65) Prior Publication Data

US 2023/0215923 A1 Jul. 6, 2023

Related U.S. Application Data

(62) Division of application No. 16/763,295, filed as application No. PCT/JP2018/032357 on Aug. 31, 2018, now Pat. No. 11,621,328.

(30) Foreign Application Priority Data

Nov. 16, 2017 (JP) ................................. 2017-220910

(51) Int. Cl.
*H01L 29/20* (2006.01)
*H01L 29/778* (2006.01)
*H01L 29/78* (2006.01)

(52) U.S. Cl.
CPC ...... *H01L 29/2003* (2013.01); *H01L 29/7786* (2013.01); *H01L 29/78* (2013.01)

(58) Field of Classification Search
CPC .. H01L 29/2003; H01L 29/7786; H01L 29/78
See application file for complete search history.

(56) References Cited

U.S. PATENT DOCUMENTS 7,157,748 B2 * 1/2007 Saito ................... H01L 29/7786
257/E29.253
7,439,555 B2 10/2008 Beach et al.
(Continued)

FOREIGN PATENT DOCUMENTS

JP 2011-138916 A 7/2011
JP 4985760 B2 7/2012
(Continued)

OTHER PUBLICATIONS

International Search Report dated Jun. 11, 2018, issued in counterpart International Application No. PCT/JP2018/032357 (1 page).
(Continued)

*Primary Examiner* — Jay C Kim
(74) *Attorney, Agent, or Firm* — WHDA, LLP

(57) ABSTRACT

A nitride semiconductor device includes a substrate, a drift layer and a block layer sequentially provided above the substrate, a gate opening penetrating through a block layer and reaching a drift layer, an electron transit layer and an electron supply layer sequentially provided above the block layer and along the inner surface of the gate opening, a gate electrode provided to cover the gate opening, a source opening penetrating through an electron supply layer and an electron transit layer and reaching the block layer, a source electrode provided in the source opening, and a drain electrode on the rear surface side of the substrate. Seen in a plan view, at least part of an outline of an end of the gate opening in the longitudinal direction follows an arc or an elliptical arc.

11 Claims, 11 Drawing Sheets

(56) References Cited

U.S. PATENT DOCUMENTS

| | | | |
|---|---|---|---|
| 7,592,647 B2 | 9/2009 | Nakata et al. | |
| 7,821,032 B2 | 10/2010 | Kinzer | |
| 8,044,434 B2 | 10/2011 | Ohta et al. | |
| 8,227,810 B2 * | 7/2012 | Okada | H01L 29/872 |
| | | | 257/E21.403 |
| 8,441,035 B2 | 5/2013 | Hikita et al. | |
| 8,866,155 B2 | 10/2014 | Hayashi | |
| 8,890,239 B2 | 11/2014 | Yaegashi et al. | |
| 8,896,058 B2 * | 11/2014 | Okada | H01L 29/7827 |
| | | | 257/302 |
| 8,941,174 B2 | 1/2015 | Okada et al. | |
| 9,196,731 B2 * | 11/2015 | Kume | H01L 29/7787 |
| 9,368,609 B2 * | 6/2016 | Okamoto | H01L 29/7786 |
| 9,660,038 B2 | 5/2017 | Simin et al. | |
| 9,911,843 B2 | 3/2018 | Umeda et al. | |
| 10,050,138 B2 | 8/2018 | Shibata et al. | |
| 10,686,042 B2 | 6/2020 | Ujita et al. | |
| 10,777,676 B2 * | 9/2020 | Uchida | H01L 29/0696 |
| 2011/0156050 A1 | 6/2011 | Okada et al. | |
| 2014/0004668 A1 | 1/2014 | Saitoh et al. | |
| 2016/0329421 A1 * | 11/2016 | Shibata | H01L 29/7788 |
| 2018/0350965 A1 | 12/2018 | Shibata et al. | |
| 2019/0198622 A1 * | 6/2019 | Uchida | H01L 29/1608 |

FOREIGN PATENT DOCUMENTS

| | | |
|---|---|---|
| JP | 2013-62442 A | 4/2013 |
| WO | 2017/138505 A1 | 8/2017 |

OTHER PUBLICATIONS

International Search Report dated Nov. 6, 2018, issued in counterpart International Application No. PCT/JP2018/032357 (1 page).

* cited by examiner

NITRIDE SEMICONDUCTOR DEVICE

CROSS REFERENCE TO RELATED APPLICATIONS

This application is a Division of U.S. patent application Ser. No. 16/763,295, filed May 12, 2020, which is a National Stage Entry of International Application No. PCT/JP2018/032357 filed Aug. 31, 2018, which claims the benefit of Japanese Patent Application No. 2017-220910 filed in the Japan Patent Office on Nov. 16, 2017, each of which is incorporated by reference herein in its entirety.

TECHNICAL FIELD

The present disclosure relates to nitride semiconductor devices.

BACKGROUND ART

Nitride semiconductors such as gallium nitride (GaN) are wide-bandgap semiconductors having a large band gap, and having a higher dielectric breakdown field and a higher saturated drift velocity of electrons than those of gallium arsenide (GaAs) semiconductors or silicon (Si) semiconductors. For this reason, research and development of power transistors have been performed using nitride semiconductors which are advantageous in increasing the output and the breakdown voltage.

For example, PTL 1 discloses a semiconductor device including a GaN laminate. The semiconductor device according to PTL 1 includes a regrown layer to cover openings disposed in the GaN laminate, and a gate electrode above the regrown layer along the regrown layer. The regrown layer includes a channel to provide high mobility of the channel and attain the breakdown voltage in the longitudinal direction and the breakdown voltage performance at the end of the gate electrode.

CITATION LIST

Patent Literature

PTL 1: Japanese Unexamined Patent Application Publication No. 2011-138916

SUMMARY OF THE INVENTION

Technical Problems

However, the conventional nitride semiconductor device described above has problems such as generation of leakage current between the gate and the source at the end of the opening, and a reduction in breakdown voltage of the semiconductor device.

The present disclosure provides a nitride semiconductor device a low leakage current and a high breakdown voltage.

Solutions to Problems

To solve the problems described above, the nitride semiconductor device according to one aspect of the present disclosure includes a nitride semiconductor device, including: a substrate having a first main surface and a second main surface on a reverse side of the first main surface; a first nitride semiconductor layer of a first conductivity type above the first main surface; a block layer above the first nitride semiconductor layer; a first opening penetrating through the block layer and reaching the first nitride semiconductor layer; an electron transit layer and an electron supply layer provided sequentially above the block layer and along an inner surface of the first opening, the electron transit layer being closer to the substrate than the electron supply layer; a gate electrode provided above the electron supply layer to cover the first opening; a second opening in a location away from the gate electrode, the second opening penetrating through the electron supply layer and the electron transit layer and reaching the block layer; a source electrode provided in the second opening and connected to the block layer; and a drain electrode on a second main surface-side of the substrate. When the first main surface is seen in a plan view, (i) the first opening and the source electrode each are elongated in a predetermined direction, and (ii) at least part of an outline of a first end of the first opening in a longitudinal direction follows an arc or an elliptical arc.

Advantageous Effects of Invention

The present disclosure can provide a nitride semiconductor device having a low leakage current and a high breakdown voltage.

DESCRIPTION OF EXEMPLARY EMBODIMENTS

Figure 1:
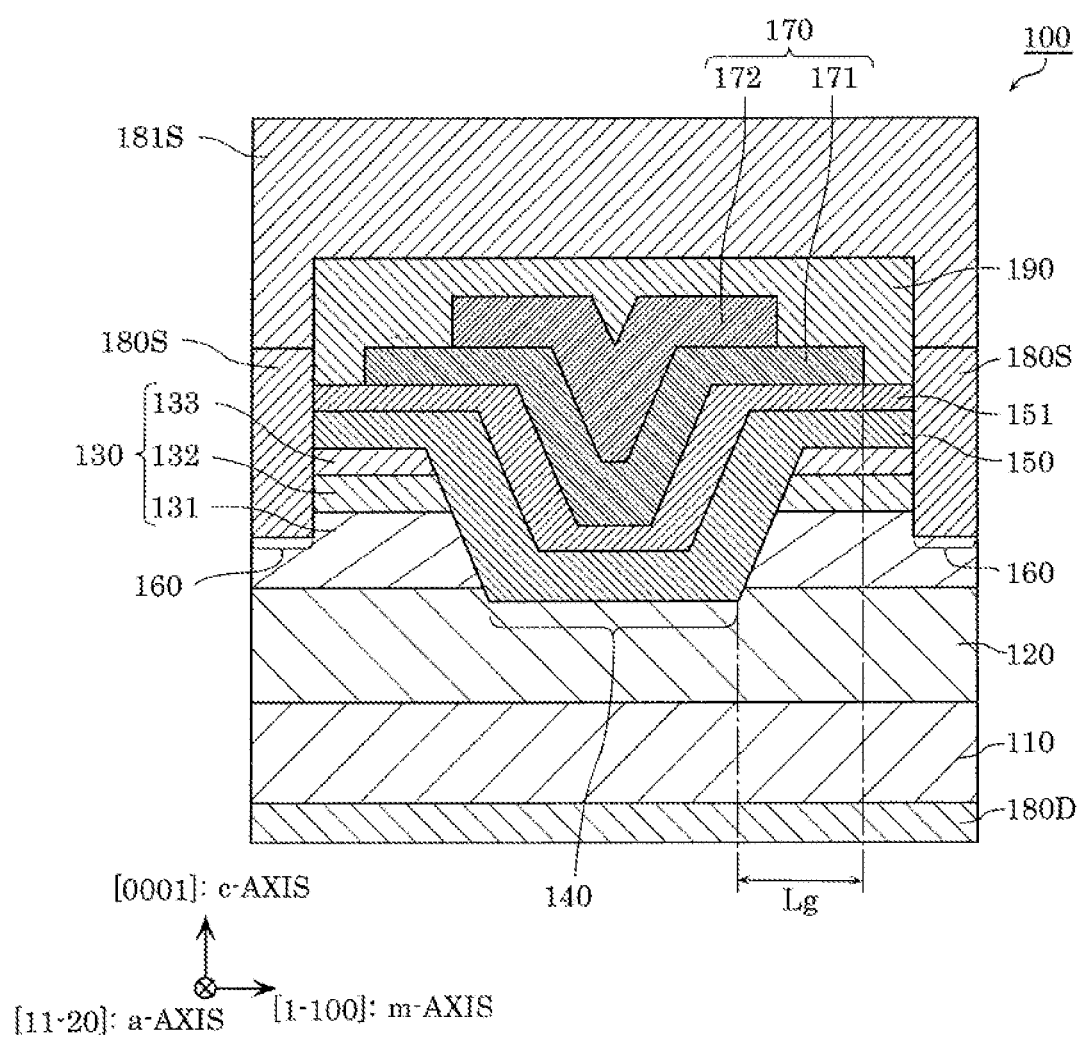
FIG. 1 is a sectional view of the nitride semiconductor device according to Embodiment 1.

Underlying Knowledge Forming Basis of the Present Disclosure

The present inventors have found that the conventional semiconductor device described in "Background Art" has the following problems.

In the conventional semiconductor device, abnormal growth of the regrown layer was found at the ends of the openings. The present inventors, who have examined the cause of the abnormal growth, have found that it is attributed to the hexagonal shape of the end of the opening seen in a plan view in the conventional semiconductor. Specifically, the vertices of the hexagonal end of the opening serve as singular growth points, and growth from the side wall of the opening occurred in a plurality of directions near the vertex. Voids were generated in the regrown layer near the vertices, and caused the leakage current to reduce the breakdown voltage of the semiconductor device.

Thus, the leakage current is generated and the breakdown voltage is reduced in the conventional semiconductor device.

To solve such problems above, the nitride semiconductor device according to one aspect of the present disclosure includes a nitride semiconductor device, including: a substrate having a first main surface and a second main surface on a reverse side of the first main surface; a first nitride semiconductor layer of a first conductivity type above the first main surface; a block layer above the first nitride semiconductor layer; a first opening penetrating through the block layer and reaching the first nitride semiconductor layer; an electron transit layer and an electron supply layer provided sequentially above the block layer and along an inner surface of the first opening, the electron transit layer being closer to the substrate than the electron supply layer; a gate electrode provided above the electron supply layer to cover the first opening; a second opening in a location away from the gate electrode, the second opening penetrating through the electron supply layer and the electron transit layer and reaching the block layer; a source electrode provided in the second opening and connected to the block layer; and a drain electrode on a second main surface-side of the substrate. When the first main surface is seen in a plan view, (i) the first opening and the source electrode each are elongated in a predetermined direction, and (ii) at least part of an outline of a first end of the first opening in a longitudinal direction follows an arc or an elliptical arc.

In such a configuration, because at least part of the outline of the end of the first opening seen in a plan view follows an arc or an elliptical arc, a drastic change in the growth direction from the side wall of the first opening is suppressed. Because such a change in the growth direction is suppressed, abnormal growth in the regrown layers such as the electron supply layer and the electron transit layer is suppressed, improving the film quality of the regrown layers at the end of the first opening. Accordingly, the leakage current at the end is suppressed, thus suppressing a reduction in breakdown voltage of the nitride semiconductor device. Thus, the nitride semiconductor device according to this aspect can have a low leakage current and a high breakdown voltage.

Moreover, for example, the gate electrode may include a metal film, and a semiconductor layer of a second conductivity type sandwiched between the metal film and the electron supply layer, the second conductivity type having a polarity different from the polarity of the first conductivity type.

In such a configuration, because the potential of the channel formed in a region under the gate electrode is raised by the semiconductor layer, the carrier concentration in a region under the gate electrode can be reduced. Accordingly, the nitride semiconductor device can operate in a normally-off mode.

Moreover, for example, when the first main surface is seen in a plan view, the first opening may have two straight portions linearly extending in the longitudinal direction with the source electrode being interposed between the two straight portions, and a first connection portion which is the first end connecting one ends of the two straight portions.

In such a configuration, the outline of the connection portion connecting the two straight portions corresponds to an arc or an elliptical arc having a large diameter. For this reason, a drastic change in the growth direction from the side wall of the connection portion is further suppressed, thus suppressing the abnormal growth of the regrown layer. Accordingly, the leakage current near the connection portion is suppressed, thus suppressing a reduction in breakdown voltage of the nitride semiconductor device.

Moreover, for example, the first main surface may have an off angle defining an inclination of the first main surface along the longitudinal direction.

In such a configuration, the film quality of the nitride semiconductor formed by epitaxial growth or the like is increased. Because defects in the nitride semiconductor are suppressed, the leakage current attributed to such defects can be reduced, increasing the breakdown voltage of the nitride semiconductor device.

Moreover, for example, among two ends of the first opening in the longitudinal direction, the first end may be an end on a raised side of the inclination defined by the off angle of the first main surface. When the first main surface is seen in a plan view, (a) the gate electrode may surround the source electrode, (b) a first distance may be a distance on a first virtual straight line in the longitudinal direction and between an outline of the first connection portion on a source electrode side and an outline of the gate electrode on the source electrode side, and (c) a second distance may be a distance on a second virtual straight line orthogonal to the first virtual straight line and between an outline of the straight portion on the source electrode side and the outline of the gate electrode on the source electrode side. The first distance may be longer than the second distance.

In such a configuration, the region where abnormal growth is caused by the off angle can be spaced from the source electrode, and a regrown layer without abnormal growth is readily formed near the source electrode. For this reason, the channel is appropriately controlled by the gate electrode, enabling the suppression of the leakage current between the gate and the source. Accordingly, the nitride semiconductor device according to this aspect can have a further reduced leakage current and a further increased breakdown voltage.

Moreover, for example, the first opening may further include a second connection portion opposite to the first connection portion, the second connection portion connecting other ends of the two straight portions. At least part of an outline of the second connection portion may follow an arc or an elliptical arc.

In such a configuration, abnormal growth is suppressed in the two ends of the first opening. Accordingly, the leakage current at the two ends is suppressed, thus suppressing a reduction in breakdown voltage of the nitride semiconductor device.

Moreover, for example, a third distance may be less than or equal to the first distance, the third distance being a distance on the first virtual straight line and between an outline of the second connection portion on the source electrode side and the outline of the gate electrode on the source electrode side.

In such a configuration, the region where abnormal growth is caused by the off angle can be spaced from the source electrode, thereby suppressing the leakage current between the gate and the source. Accordingly, the nitride semiconductor device according to this aspect can have a further reduced leakage current and a further increased breakdown voltage.

Moreover, for example, the third distance may be equal to the second distance.

In such a configuration, an unnecessary space in the planar layout can be reduced, providing a nitride semiconductor device of a reduced size.

Moreover, for example, at least part of an outline of a second end opposite to the first end of the first opening in the longitudinal direction may follow an arc or an elliptical arc.

In such a configuration, abnormal growth is suppressed at the two ends of the first opening. Accordingly, the leakage current at the two ends is suppressed, thereby suppressing a reduction in breakdown voltage of the nitride semiconductor device.

Moreover, for example, the nitride semiconductor device may include the source electrode including two or more source electrodes and the first opening including two or more first openings, and portions of the two or more first openings extending in the longitudinal direction and the two or more source electrodes may be alternately aligned in a direction intersecting perpendicular to the longitudinal direction.

In such a configuration, a plurality of channels having a short channel length can be disposed in plane, increasing the output of the nitride semiconductor device.

Moreover, for example, at least part of an outline of the first end may follow an arc or an elliptical arc.

In such a configuration, the growth direction from the side wall of the first opening smoothly changes, thereby sufficiently suppressing singular growth points. Accordingly, the abnormal growth of the regrown layer is sufficiently suppressed, thereby sufficiently suppressing the leakage current.

Moreover, for example, at least part of the outline of the first end may have vertices located on an arc or an elliptical arc, and vertex angles at the vertices may be greater than 120°.

In such a configuration, the growth directions from the side wall of the first opening are substantially the same as those near the vertices. For this reason, a drastic change in the growth direction near vertices is suppressed, thereby suppressing generation of singular growth points. Accordingly, the abnormal growth of the regrown layer is suppressed, sufficiently suppressing the leakage current.

Moreover, for example, the block layer may include a second nitride semiconductor layer of a second conductivity type having a polarity different from a polarity of the first conductivity type.

In such a configuration, a depletion layer is formed at an interface between the first nitride semiconductor layer and the second nitride semiconductor layer, thereby increasing the performance of blocking carriers by the block layer. Accordingly, the generation of the leakage current between the source and the drain can be suppressed, thereby increasing the breakdown voltage of the nitride semiconductor device.

Embodiments will now be specifically described with reference to the drawings.

The embodiments described below all are comprehensive or illustrative. Numeral values, shapes, materials, components, arrangements, positions, and connection forms of the components, steps, order of the steps, and the like shown in the embodiments below are only examples, and will not limit the present disclosure. Moreover, among the components of the embodiments below, the components not described in an independent claim will be described as arbitrary components.

The drawings are schematic views, and are not always strictly illustrated. Accordingly, for example, the scale is not always consistent among the drawings. In the drawings, identical referential numerals are given in substantially identical configurations, and the duplication of the description thereof will be omitted or simplified.

In this specification, terms representing relations among elements such as parallel or orthogonal, terms representing shapes of elements such as a rectangular or circular shape and ranges of numeric values are expressions including substantially equal ranges, such as differences of several percentage, rather than those representing only strict meanings.

In this specification, terms "upper" and "lower" do not represent upper (vertically upper) and lower (vertically lower) directions in absolute spatial recognition, and are used as terms defined by relatively positional relations based on the lamination order of a laminate structure. In this specification, with respect to the substrate, the side including the drift layer and the gate electrode is defined as "upper", and the side including the drain electrode is defined as "lower". The terms "upper" and "lower" are applied not only to the case where two components are spaced from each other and another component is interposed between the two components but also to the case where the two components are disposed in close contact with each other.

In this specification and the drawings, the a-axis, the m-axis, and the c-axis indicate crystal orientations of the hexagonal crystal. The a-axis direction is the direction represented by [11-20]. The m-axis direction is the direction represented by [1-100]. The c-axis direction is the direction represented by [0001]. The a-axis, the m-axis, and the c-axis are orthogonal to each other.

In this specification, the expression "seen in a plan view" indicates seeing the top surface of the substrate in the c-axis direction. Specifically, "seen in a plan view" corresponds to the case where the c-plane represented by (0001) is seen from the front.

In this specification, AlGaN indicates ternary mixed crystal $Al_xGa_{1-x}N$ (where $0 \leq x \leq 1$). Hereinafter, multinary mixed crystals each will be abbreviated according to the arrangement of constitutional elements, such as AlInN or GaInN. For example, one of nitride semiconductors $Al_xGa_{1-x-y}In_yN$ (where $0 \leq x \leq 1$, $0 \leq y \leq 1$, and $x+y=1$) is abbreviated to AlGaInN.

Embodiment 1

Configuration

First, the configuration of the nitride semiconductor device according to Embodiment 1 will be described with reference to FIGS. 1 and 2.

FIG. 1 is a sectional view of nitride semiconductor device 100 according to the present embodiment. FIG. 2 is a plan view illustrating a planar layout of nitride semiconductor device 100 according to the present embodiment.

Figure 2:
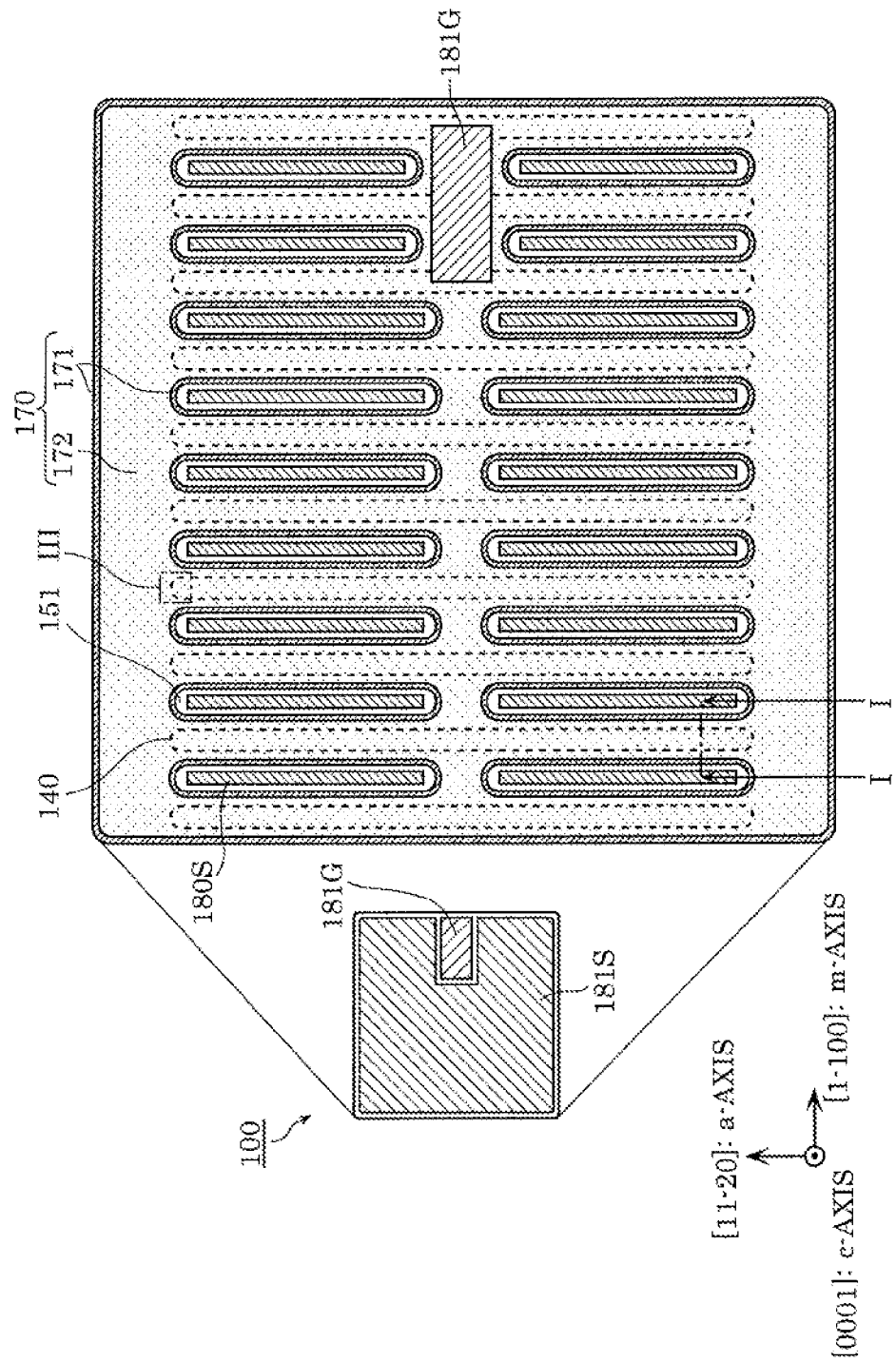
FIG. 2 is a plan view illustrating a planar layout of the nitride semiconductor device according to Embodiment 1.

Here, FIG. 1 illustrates a cross-section of nitride semiconductor device 100 according to the present embodiment taken along line I-I in FIG. 2. FIG. 2 illustrates a plan view of nitride semiconductor device 100 when source electrode pad 181S and insulating layer 190 are perspectively viewed. For this reason, as seen in comparison with FIG. 1, the plan view illustrated in FIG. 2 illustrates gate metal film 172, part of threshold control layer 171, part of electron supply layer 151, and source electrode 180S.

Nitride semiconductor device 100 is a device having a laminate structure including semiconductor layers containing nitride semiconductors such as GaN and AlGaN as the main components. Specifically, nitride semiconductor device 100 has a hetero structure of an AlGaN film and a GaN film.

In the hetero structure of an AlGaN film and a GaN film, spontaneous polarization or piezoelectric polarization on plane (0001) generates a high concentration of two-dimensional electron gas (2DEG) at the hetero interface. For this reason, even if undoped, the interface has a sheet carrier concentration of $1 \times 10^{13}$ cm$^{-2}$ or more.

Nitride semiconductor device 100 according to the present embodiment is a field effect transistor (FET) using the two-dimensional electron gas generated at the AlGaN/GaN hetero interface as the channel. Specifically, nitride semiconductor device 100 is a so-called vertical FET.

As illustrated in FIG. 1, nitride semiconductor device 100 includes substrate 110, drift layer 120, block layer 130, gate opening 140, electron transit layer 150, electron supply layer 151, source opening 160, gate electrode 170, source electrode 180S, drain electrode 180D, gate electrode pad 181G, source electrode pad 181S, and insulating layer 190. Block layer 130 includes first block layer 131, second block layer 132, and third block layer 133. In the present embodiment, the interface between electron transit layer 150 and electron supply layer 151 corresponds to the AlGaN/GaN hetero interface. In such a configuration, 2DEG generates in electron transit layer 150 to form a channel.

Substrate 110 is made of a nitride semiconductor, and has a first main surface on one side thereof and a second main surface on its reverse side. The first main surface is a main surface including drift layer 120 formed thereof. Specifically, the first main surface approximately corresponds to the c-plane. The second main surface is a main surface including drain electrode 180D formed thereon.

Substrate 110 is a substrate made of n$^+$ type GaN, for example. The terms "n-type" and "p-type" indicate the conductivity types of the semiconductor. In the present embodiment, the n-type is one example of the first conductivity type of the nitride semiconductor. The p-type is one example of the second conductivity type of a polarity different from that of the first conductivity type. The n$^+$ type indicates a so-called heavily doped state where an excessively large amount of n-type dopant is added to the semiconductor. The n$^-$ type indicates a so-called lightly doped state where an excessively small amount of n-type dopant is added to the semiconductor. The same applies to the p$^+$ type and the p$^-$ type. Note that the i-type indicates the state in which the dopant is not added.

Drift layer 120 is one example of a first nitride semiconductor layer of a first conductivity type provided above the first main surface of substrate 110. Drift layer 120 is a film made of n$^-$ type GaN and having a film thickness of 8 μm. Drift layer 120 is disposed in contact with the first main surface of substrate 110. Drift layer 120 has a carrier concentration in the range of $1 \times 10^{15}$ cm$^{-3}$ or more and $1 \times 10^{17}$ cm$^{-3}$ or less, for example, although not limited thereto. Drift layer 120 is formed above the first main surface of substrate 110 by crystal growth using metalorganic vapor phase epitaxy (MOVPE), for example.

Block layer 130 is provided above drift layer 120. Block layer 130 suppresses the leakage current between source electrode 180S and drain electrode 180D. Specifically, block layer 130 is made of a laminate of first block layer 131, second block layer 132, and third block layer 133 disposed in this order.

First block layer 131 is one example of a second nitride semiconductor layer of a second conductivity type having a polarity different from that of the first conductivity type. For example, first block layer 131 is a p-type nitride semiconductor layer formed of a p-type GaN and having a thickness of 400 nm, and is disposed in contact with the upper surface of drift layer 120. First block layer 131 is formed by a crystal growth method, such as MOVPE, subsequently to the step of forming drift layer 120, although not limited thereto. First block layer 131 may be formed through ion injection of magnesium (Mg) into i-type GaN, for example.

Here, in the case where a reverse voltage is applied to the p-n junction formed by first block layer 131 and drift layer 120, specifically, in the case where the potential of drain electrode 180D is higher than that of source electrode 180S, a depletion layer extends in drift layer 120. As a result, the breakdown voltage of nitride semiconductor device 100 can be increased.

First block layer 131 may be an insulating layer. For example, first block layer 131 may be an insulating layer formed through ion injection of iron (Fe) into i-type GaN. In this case, the breakdown voltage is determined only by the film thickness of first block layer 131. By increasing the thickness of first block layer 131, nitride semiconductor device 100 can have increased breakdown voltage.

Second block layer 132 is provided above first block layer 131. Second block layer 132 is formed of an insulating or semi-insulating nitride semiconductor. For example, second block layer 132 is a nitride semiconductor layer formed of GaN doped with carbon and having a thickness of 200 nm, and is disposed in contact with the upper surface of first block layer 131. Second block layer 132 is formed by a crystal growth method, such as MOVPE, subsequently to the step of forming first block layer 131, for example.

In some cases, second block layer 132 may contain silicon (Si) or oxygen (O), which is mixed during film formation. In such a case, the carbon concentration of second block layer 132 is smaller than the silicon concentration or the oxygen concentration. For example, second block layer 132 has a carbon concentration of $3 \times 10^{17}$ cm$^{-3}$ or more, for example; and second block layer 132 may have a carbon concentration of $1 \times 10^{18}$ cm$^{-3}$ or more. Second block layer 132 has a silicon concentration or oxygen concentration of $5 \times 10^{16}$ cm$^{-3}$ or less, for example; and second block layer 132 may have a silicon concentration or oxygen concentration of $2 \times 10^{16}$ cm$^{-3}$ or less.

Second block layer 132 may contain any one or more of iron (Fe), magnesium (Mg), and boron (B). Specifically, second block layer 132 may be formed through ion injection of Fe, Mg, or B to GaN. The ion to be injected can be any ion species other than the ion spices above as long as it can increase the resistance of second block layer 132.

Second block layer 132 suppresses formation of a parasitic npn structure. For this reason, malfunction of nitride semiconductor device 100 caused by the formation of the parasitic npn structure can be reduced.

If nitride semiconductor device 100 does not include second block layer 132, nitride semiconductor device 100 has a laminate structure of n-type electron supply layer 151, electron transit layer 150 and third block layer 133/p-type first block layer 131/n-type drift layer 120 between source electrode 180S and drain electrode 180D. This laminate structure corresponds to the structure of a parasitic bipolar transistor having a parasitic npn structure.

When nitride semiconductor device 100 is turned off and a current flows in first block layer 131, this parasitic bipolar transistor is undesirably turned on to reduce the breakdown voltage of nitride semiconductor device 100 in some cases. In this case, nitride semiconductor device 100 readily malfunctions. In the case where the influences by the parasitic bipolar transistor are sufficiently small, nitride semiconductor device 100 does not need to include second block layer 132.

Third block layer 133 is provided above second block layer 132. Third block layer 133 is a nitride semiconductor layer formed of AlGaN and having a thickness of 20 nm, for example, and is disposed in contact with the upper surface of second block layer 132. Third block layer 133 may be formed of InAlGaN. Third block layer 133 is formed by a crystal growth method, such as MOVPE, subsequently to the step of forming second block layer 132, for example.

Third block layer 133 suppresses the diffusion of p-type impurities, such as Mg, from first block layer 131. If Mg diffuses to the channel in electron transit layer 150, the carrier concentration of 2DEG may be reduced to increase the on-resistance. It is noted that the degree of diffusion of Mg varies according to the growth condition of epitaxial growth. For this reason, in the case where the diffusion of Mg is suppressed, nitride semiconductor device 100 does not need to include third block layer 133.

Third block layer 133 may have a function to supply electrons to the channel formed at the interface between electron transit layer 150 and electron supply layer 151. Third block layer 133 has a band gap larger than that of electron supply layer 151, for example.

Gate opening 140 is one example of a first opening penetrating through block layer 130 and reaching drift layer 120. Specifically, gate opening 140 penetrates through the upper surface of third block layer 133, third block layer 133, second block layer 132, and first block layer 131 in this order, and reaches drift layer 120. In the present embodiment, as illustrated in FIG. 1, the bottom surface of gate opening 140 is located at a level lower than the interface between drift layer 120 and first block layer 131.

In the present embodiment, gate opening 140 is formed to have an opening area which increases as the distance from substrate 110 is increased. Specifically, the lateral surface of gate opening 140 is inclined. For example, the cross-section of gate opening 140 has a shape of an inverted trapezoid, more specifically, an inverted isosceles trapezoid. In FIG. 2, the outline of the bottom surface of gate opening 140 is indicated by the dashed line. The outline of the upper end of gate opening 140 is larger than that illustrated in FIG. 2.

Gate opening 140 is formed as follows: Drift layer 120 to third block layer 133 are sequentially formed above the first main surface of substrate 110, and third block layer 133, second block layer 132, and first block layer 131 are etched such that drift layer 120 is partially exposed. At this time, a portion of the surface layer of drift layer 120 is also removed to form the bottom surface of gate opening 140 at a level lower than the upper surface of drift layer 120. Gate opening 140 is formed into a predetermined shape through patterning by photolithography and dry etching, for example.

Electron transit layer 150 is a regrown layer above block layer 130 along the inner surface of gate opening 140. Specifically, electron transit layer 150 having substantially a uniform film thickness is formed along the upper surface of third block layer 133 and the lateral surface and bottom surface of gate opening 140. For example, electron transit layer 150 is formed of GaN having a thickness of 100 nm. Electron transit layer 150 is formed through crystal regrowth after the formation of gate opening 140.

Electron transit layer 150 is in contact with drift layer 120 at a position corresponding to the bottom surface of gate opening 140, and is in contact with block layer 130 at a position corresponding to the lateral surface of gate opening 140. Furthermore, electron transit layer 150 is in contact with the upper surface of block layer 130, specifically, the upper surface of third block layer 133.

Electron transit layer 150 has a channel. Specifically, the two-dimensional electron gas is formed as a channel near the interface between electron transit layer 150 and electron supply layer 151.

Although electron transit layer 150 is undoped, for example, electron transit layer 150 may be doped with Si or the like to be converted into the n-type. Alternatively, for example, an AlN film having a film thickness of about 1 nm may be disposed between electron transit layer 150 and electron supply layer 151. The AlN film can suppress the alloy scattering to improve the mobility of the channel.

Electron supply layer 151 is a regrown layer above block layer 130 and along the inner surface of gate opening 140. Electron transit layer 150 and electron supply layer 151 are disposed in this order with respect to substrate 110. Specifically, electron supply layer 151 having substantially a uniform film thickness is formed along the upper surface of electron transit layer 150. For example, electron supply layer 151 is formed of AlGaN having a thickness of 50 nm. Electron supply layer 151 is in contact with the upper surface of electron transit layer 150 to form the AlGaN/GaN hetero interface. Electron supply layer 151 is formed through crystal regrowth subsequently to the formation of electron transit layer 150.

Electron supply layer 151 supplies electrons to the channel formed in electron transit layer 150. In the present embodiment, as described above, third block layer 133 also has the function to supply electrons. Both of electron supply layer 151 and third block layer 133 are formed of AlGaN. The Al compositional proportion is not particularly limited. For example, the Al compositional proportion of electron supply layer 151 may be 20%, and the Al compositional proportion of third block layer 133 may be 25%.

Source opening 160 is one example of a second opening in a location away from gate electrode 170, the second opening penetrating through electron supply layer 151 and electron transit layer 150 and reaching block layer 130. Specifically, source opening 160 penetrates through electron supply layer 151, electron transit layer 150, third block layer 133, and second block layer 132 in this order, and reaches first block layer 131. In the present embodiment, as illustrated in FIG. 1, the bottom surface of source opening 160 is located at a level lower than the interface between first block layer 131 and second block layer 132. Source opening 160 is arranged in a location away from gate opening 140 seen in a plan view.

As illustrated in FIG. 1, source opening 160 has a substantially fixed opening area. Specifically, the lateral surface of source opening 160 is approximately parallel to the thickness direction of substrate 110. For example, the cross-section of source opening 160 has a rectangular shape. Alternatively, cross-section of source opening 160 may have an inverted trapezoid as in gate opening 140.

Source opening 160 is formed as follows: Subsequent to the step of forming electron supply layer 151 or threshold control layer 171, electron supply layer 151, electron transit layer 150, third block layer 133, and second block layer 132 are etched such that first block layer 131 is exposed in a region different from that of gate opening 140. At this time, a portion of the surface layer of first block layer 131 is also removed to form the bottom surface of source opening 160 at a lower level than the upper surface of first block layer 131. Source opening 160 is formed into a predetermined shape through patterning by photolithography and dry etching, for example.

Gate electrode 170 is provided above electron supply layer 151 to cover gate opening 140. Gate electrode 170 includes threshold control layer 171 and gate metal film 172.

Threshold control layer 171 is one example of a semiconductor layer of a second conductivity type sandwiched between gate metal film 172 and electron supply layer 151. Specifically, threshold control layer 171 having a shape along the upper surface of electron supply layer 151 is formed in contact with the upper surface of electron supply layer 151 to have a substantially uniform film thickness. For example, threshold control layer 171 is formed of p-type AlGaN having a film thickness of 200 nm. Threshold control layer 171 is disposed in contact with the upper surface of electron supply layer 151 and the lower surface of gate metal film 172.

Threshold control layer 171 is formed through crystal regrowth and patterning subsequently to the formation of electron supply layer 151, for example. Threshold control layer 171 may be formed through crystal regrowth and patterning after the formation of source opening 160.

Threshold control layer 171 raises the potential of the channel formed in a region under gate metal film 172. Such a channel can increase the threshold voltage, resulting in nitride semiconductor device 100 of a normally-off type.

Threshold control layer 171 may be formed of an insulating material, rather than a nitride semiconductor. For example, threshold control layer 171 may be formed of silicon nitride (SiN) or silicon oxide (SiO).

Gate metal film 172 is provided above electron supply layer 151 to cover gate opening 140. In the present embodiment, gate metal film 172 having a shape along the upper surface of threshold control layer 171 is formed in contact with the upper surface of threshold control layer 171 to have a substantially uniform film thickness.

Gate metal film 172 is formed using a conductive material such as a metal. For example, gate metal film 172 is formed using palladium (Pd). The material for gate metal film 172 to be used is a material Schottky connected to the n-type semiconductor. Examples thereof include nickel (Ni) materials, tungsten silicide (WSi), and gold (Au). Gate metal film 172 is formed by forming a conductive film by sputtering or deposition, and patterning the conductive film, for example.

Gate metal film 172 is formed to be spaced, when seen in a plan view, such that gate metal film 172 is not in contact with source electrode 180S. Specifically, seen in a plan view, gate metal film 172 is formed within threshold control layer 171. For this reason, as illustrated in FIG. 2, seen in a plan view, threshold control layer 171 is partially illustrated along the outline of gate metal film 172.

Source electrode 180S is an electrode provided in source opening 160 and connected to block layer 130. Specifically, source electrode 180S is disposed to fill source opening 160, and is connected to first block layer 131. Source electrode 180S is in contact with the end surfaces of electron supply layer 151, electron transit layer 150, third block layer 133, and second block layer 132. Source electrode 180S forms an ohmic contact with electron transit layer 150 and electron supply layer 151.

Source electrode 180S is formed using a conductive material such as a metal. The material for source electrode 180S to be used is a material which forms an ohmic contact with an n-type semiconductor layer such as Ti/Al. Source electrode 180S is formed by forming a conductive film by sputtering or deposition, and patterning the conductive film, for example.

The connection of source electrode 180S to first block layer 131 enables fixation of the potential of first block layer 131. This stabilizes the operation of nitride semiconductor device 100.

Al is Schottky connected to first block layer 131 made of a p-type nitride semiconductor. For this reason, a metallic material, such as Pd or Ni, having a large work function and having low contact resistance to the p-type nitride semiconductor may be disposed in a lower layer portion of source electrode 180S. Such a configuration can further stabilize the potential of first block layer 131.

Drain electrode 180D is provided on the second main surface-side of substrate 110. Drain electrode 180D is formed of a conductive material such as a metal, for example. The material for drain electrode 180D to be used is a material which forms an ohmic contact with the n-type semiconductor layer such as Ti/Al, as in the case of the material for source electrode S. Drain electrode 180D is formed by forming a conductive film by sputtering or deposition, for example.

Gate electrode pad 181G is electrically connected to gate electrode 170. As illustrated in FIG. 2, gate electrode pad 181G is included in the topmost layer of nitride semiconductor device 100. In the present embodiment, gate metal film 172 is formed in the form of a single plate. For this reason, gate electrode pad 181G is disposed only in a partial region of nitride semiconductor device 100 seen in a plan view. Gate electrode pad 181G is connected to a power supply for controlling gate electrode 170.

Source electrode pad 181S is electrically connected to each of source electrodes 180S. As illustrated in FIG. 2, source electrode pad 181S is included in the topmost layer of nitride semiconductor device 100. In the present embodiment, source electrodes 180S are formed as islands. For this reach, source electrode pad 181S is disposed in most of the region of nitride semiconductor device 100 excluding gate electrode pad 181G in seen in a plan view to cover source electrodes 180S. Source electrode pad 181S is grounded, for example.

Insulating layer 190 is disposed to electrically insulate gate electrode 170 from source electrode pad 181S and source electrode 180S. Insulating layer 190 is a silicon oxide film or a silicon nitride film, for example.

Planar Layout

The planar layout of nitride semiconductor device 100 according to the present embodiment will now be described with reference to FIG. 2.

As illustrated in FIG. 2, nitride semiconductor device 100 includes a plurality of source electrodes 180S and a plurality of gate openings 140. The plurality of source electrodes 180S and the plurality of gate openings 140 are elongated in a predetermined direction. In the present embodiment, the predetermined direction corresponds to the a-axis direction of GaN which forms substrate 110. The predetermined direction, that is, the longitudinal direction may be a direction intersecting the a-axis direction. The angle formed by the predetermined direction and the a-axis direction at this time may be 1° or less.

As illustrated in FIG. 2, source electrode 180S extends linearly in an elongated manner in the a-axis direction. Seen in a plan view, source electrode 180S has a rectangular shape where the length in the longitudinal direction is sufficiently long, in other words, is 10 times or more longer than the length in the lateral direction, for example. Seen in a plan view, source electrodes 180S have substantially the same shape. In the region in which gate electrode pad 181G is disposed, the length of source electrode 180S is shortened to avoid the contact with gate electrode pad 181G.

Source electrodes 180S are aligned in the direction intersecting perpendicular to the a-axis direction, that is, in the m-axis direction. Furthermore, source electrodes 180S also are aligned in the a-axis direction. In the example illustrated in FIG. 2, nitride semiconductor device 100 includes eighteen source electrodes 180S in total, which are arranged into a matrix of two rows×nine columns. Two source electrodes 180S aligned in the a-axis direction may be formed as a single long source electrode.

Source electrodes 180S may be connected to each other via at least one ends among the two ends in the longitudinal direction. Specifically, source electrodes 180S may correspond to finger portions of an electrode formed into a comb shape.

As illustrated in FIG. 2, seen in a plan view, gate electrode 170 surrounds source electrodes 180S. Specifically, gate metal film 172 is a single electrically conductive layer disposed across substrate 110, and includes openings in the regions corresponding to source electrodes 180S. Source electrodes 180S are exposed from the openings disposed in gate metal film 172 to be electrically connected to source electrode pad 181S. The same applies to threshold control layer 171. Seen in a plan view, these openings are elongated in the a-axis direction, and the outlines of the ends in the longitudinal direction follow the arc. The openings have an elongated rectangular shape in the a-axis direction seen in a plan view. Gate electrode 170 may be a comb-shaped electrode having finger portions corresponding to gate openings 140.

Gate openings 140 extend linearly in an elongated manner in the a-axis direction. Seen in a plan view, each gate opening 140 has a rectangular shape where the length in the longitudinal direction is sufficiently long, in other words, is 10 times or more longer than the length in the lateral direction, for example. The outlines of both ends thereof in the longitudinal direction follow an arc or an elliptical arc. Each gate opening 140 extends from one end to the other end of a pair of source electrodes 180S aligned in the a-axis direction.

Gate openings 140 are aligned in the direction intersecting perpendicular to the a-axis direction, that is, in the m-axis direction. In the example illustrated in FIG. 2, nitride semiconductor device 100 includes ten gate openings 140, where gate openings 140 and source electrodes 180S are alternately aligned in the m-axis direction. The portions of gate openings 140 extending in the longitudinal direction alternate with source electrodes 180S in the m-axis direction. Gate openings 140 may be aligned in the a-axis direction as in source electrodes 180S.

In the present embodiment, the longitudinal direction of gate opening 140 corresponds to the a-axis direction, and therefore most of the side wall of gate opening 140 can be formed as the m-plane. As a result, generation of facets in the GaN crystals is suppressed in the side wall of gate opening 140. Thus, favorable electrode contact with gate electrode 170 can be provided, and the resistance of the channel along the side wall can be reduced.

Shape of End of Gate Opening

Here, the shape of end 143 of gate opening 140 seen in a plan view will be described with reference to FIG. 3.

Figure 3:
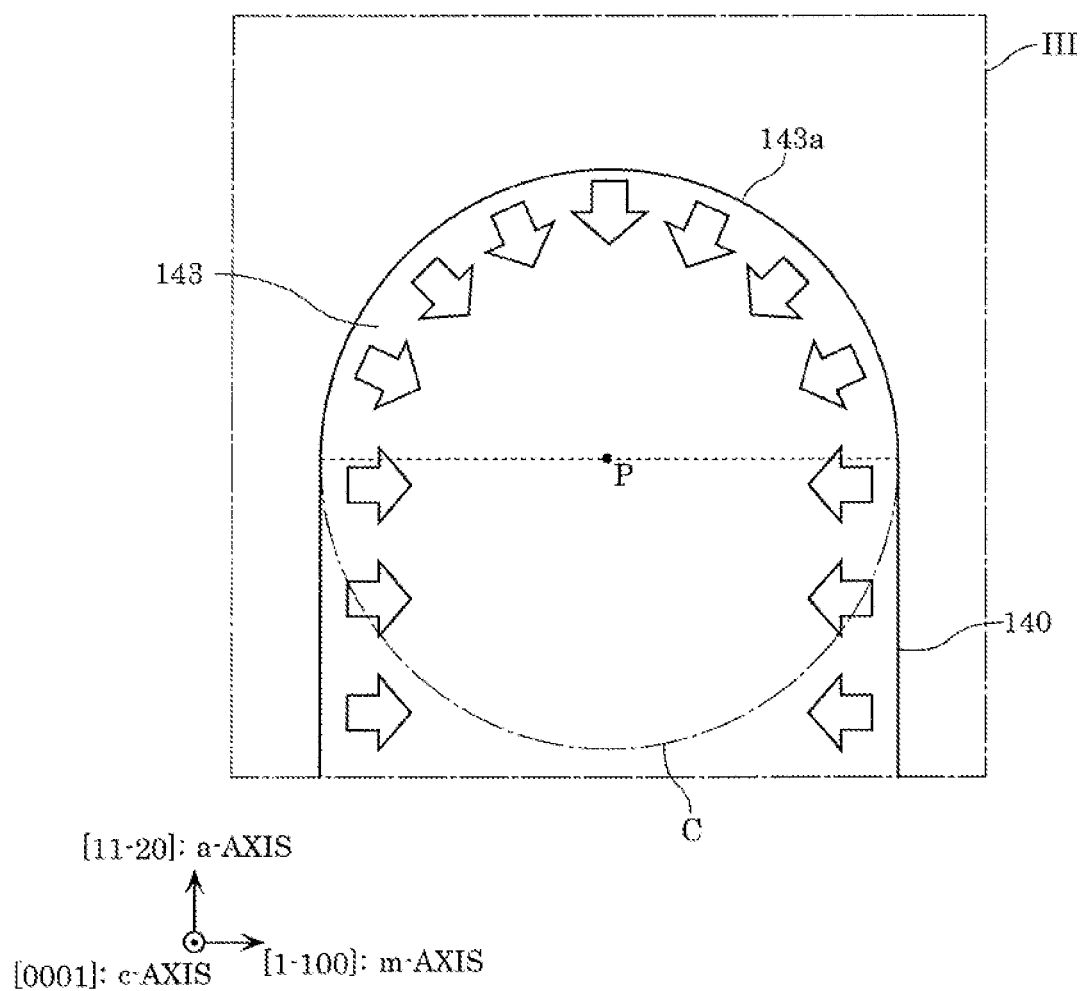
FIG. 3 is an enlarged plan view illustrating the shape of the end of the gate opening in region III of FIG. 2.

FIG. 3 is an enlarged plan view illustrating the shape of end 143 of gate opening 140 in region III of FIG. 2. FIG. 3 illustrates only gate opening 140 in the configuration of nitride semiconductor device 100. Specifically, the outline of the bottom surface of gate opening 140 is indicated with the solid line.

End 143 is one example of a first end of gate opening 140 in the longitudinal direction. As illustrated in FIG. 3, at least part of outline 143a of end 143 follows an arc or an elliptical arc. In the present embodiment, at least part of outline 143a of end 143 matches with an arc or an elliptical arc.

Specifically, outline 143a matches with an arc of circle C having point P as the center. For example, outline 143a matches with a half of the whole circumference of circle C, namely, a half arc. For example, the diameter of circle C is equal to the width (namely, the length in the lateral direction) of gate opening 140. Outline 143a may match with a quarter arc, for example, rather than the half arc.

As illustrated in FIG. 2, at least part of the outline of the end opposite to end 143 of gate opening 140 in the longitudinal direction also follows an arc or an elliptical arc. Specifically, the opposite end has an inverted shape of the shape of end 143 with respect to the m-axis.

Effects

In FIG. 3, the growth direction of the regrown layer formed inside gate opening 140 is represented by the white solid arrow. The regrown layer specifically indicates electron transit layer 150, electron supply layer 151, and threshold control layer 171.

The growth direction of the regrown layer is the direction intersecting perpendicular to the outline of gate opening 140 and directing inwardly of gate opening 140. Accordingly, because outline 143a of end 143 matches with the arc, the growth direction corresponds to the direction which directs to point P as the center of the arc and smoothly changes along the arc. In other words, a drastic change in growth direction does not occur in end 143, and singular growth points of the regrown layer are barely generated.

Because such singular growth points are barely generated, crystal regrowth is stabilized to suppress the generation of voids inside the regrown layer. The film quality of the regrown layer is improved, thereby suppressing the leakage current in end 143 and thus a reduction in breakdown voltage of nitride semiconductor device 100.

As described above, nitride semiconductor device 100 according to the present embodiment can have a low leakage current and a high breakdown voltage.

Modification

A modification of Embodiment 1 will now be described. In the present modification, the shape of the gate opening seen in a plan view is different from that of Embodiment 1. Hereinafter, differences from Embodiment 1 will be mainly described. In the present modification, the similarities to those of Embodiment 1 will not be described in particular.

Figure 4:
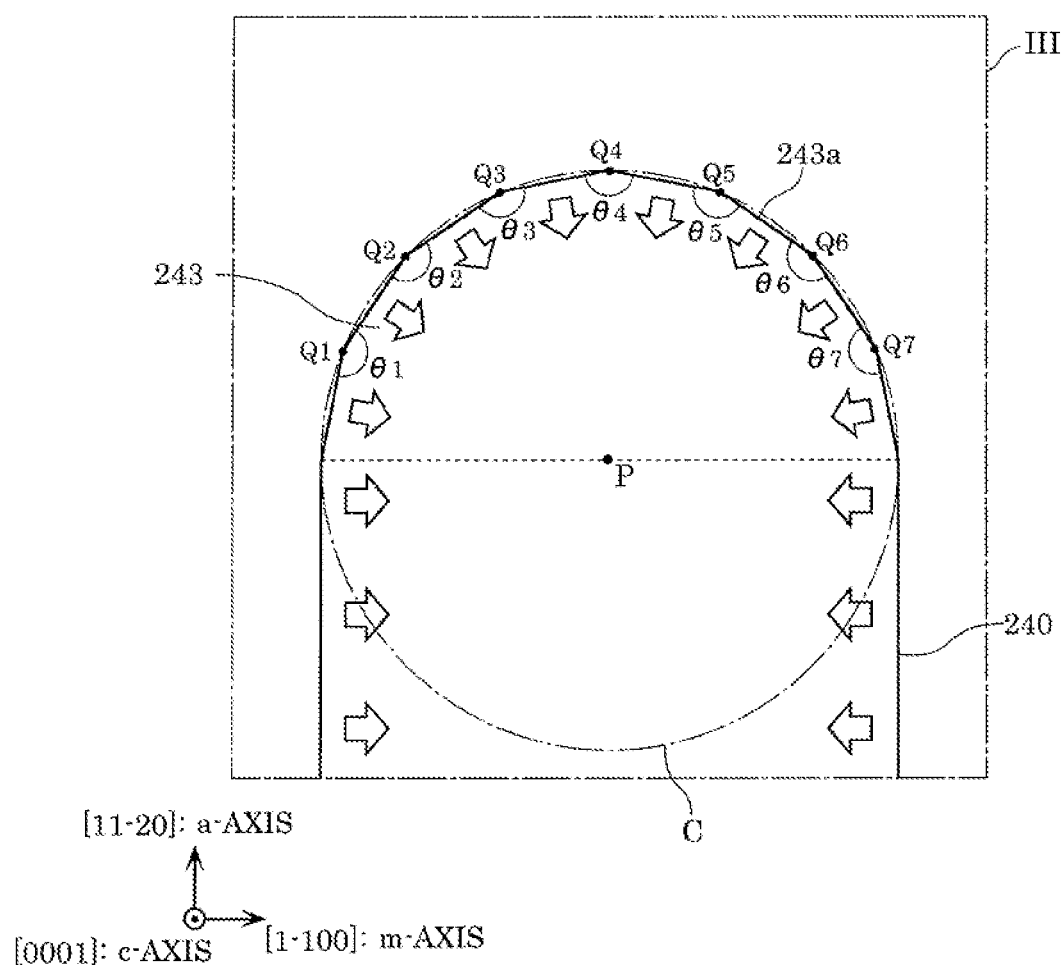
FIG. 4 is an enlarged plan view illustrating the shape of the end of the gate opening according to a modification of Embodiment 1.

FIG. 4 is an enlarged plan view illustrating the shape of end 243 of gate opening 240 according to the present modification. FIG. 4 illustrates the portion corresponding to region III of FIG. 2 as in FIG. 3.

Gate opening 240 according to the present modification corresponds to end 143 of gate opening 140 according to Embodiment 1. At least part of outline 243a of end 243 follows an arc or an elliptical arc. In the present modification, at least part of outline 243a of end 243 has a plurality of vertices located on an arc or an elliptical arc. At this time, the vertices each have a vertex angle of more than 120°.

Specifically, as illustrated in FIG. 4, outline 243a has vertices Q1 to Q7 located on an arc of circle C having point P as the center. Adjacent vertices are connected with the straight line. In other words, outline 243a matches with part of the outer circumference of a polygon. For example, outline 243a matches with part of the outer circumference of a regular n-gon. Here, n is a natural number of 7 or more. In the present modification, the value of n is 8. The vertex angles θ1 to θ7 of vertices Q1 to Q7 are 135°.

For example, the value of n is not limited to 8, and may be 16, 32, 64, 128, or 256. The vertex angles θ1 to θ7 may be the same or different. The lengths of the sides connecting the adjacent vertices may be different.

In the nitride semiconductor device according to the present modification, the growth direction changes near vertices Q1 to Q7 of end 243 of gate opening 240. At this time, a significant change in growth direction is suppressed because the vertex angles θ1 to θ7 are greater than 120°. In other words, because vertices Q1 to Q7 barely serve as singular growth points, crystal regrowth is stabilized and the generation of voids inside the regrown layer is suppressed. The film quality of the regrown layer is improved, thereby suppressing leakage current in end 243 and thus a reduction in breakdown voltage of the nitride semiconductor device according to the present modification.

As described above, the nitride semiconductor device according to the present modification can have a low leakage current and a high breakdown voltage.

Embodiment 2

Embodiment 2 will now be described.

In Embodiment 2, the shape of the gate opening seen in a plan view is different from that of Embodiment 1. Hereinafter, differences from Embodiment 1 will be mainly described. In the present modification, the similarities to those of Embodiment 1 will not be described in particular.

Figure 5:
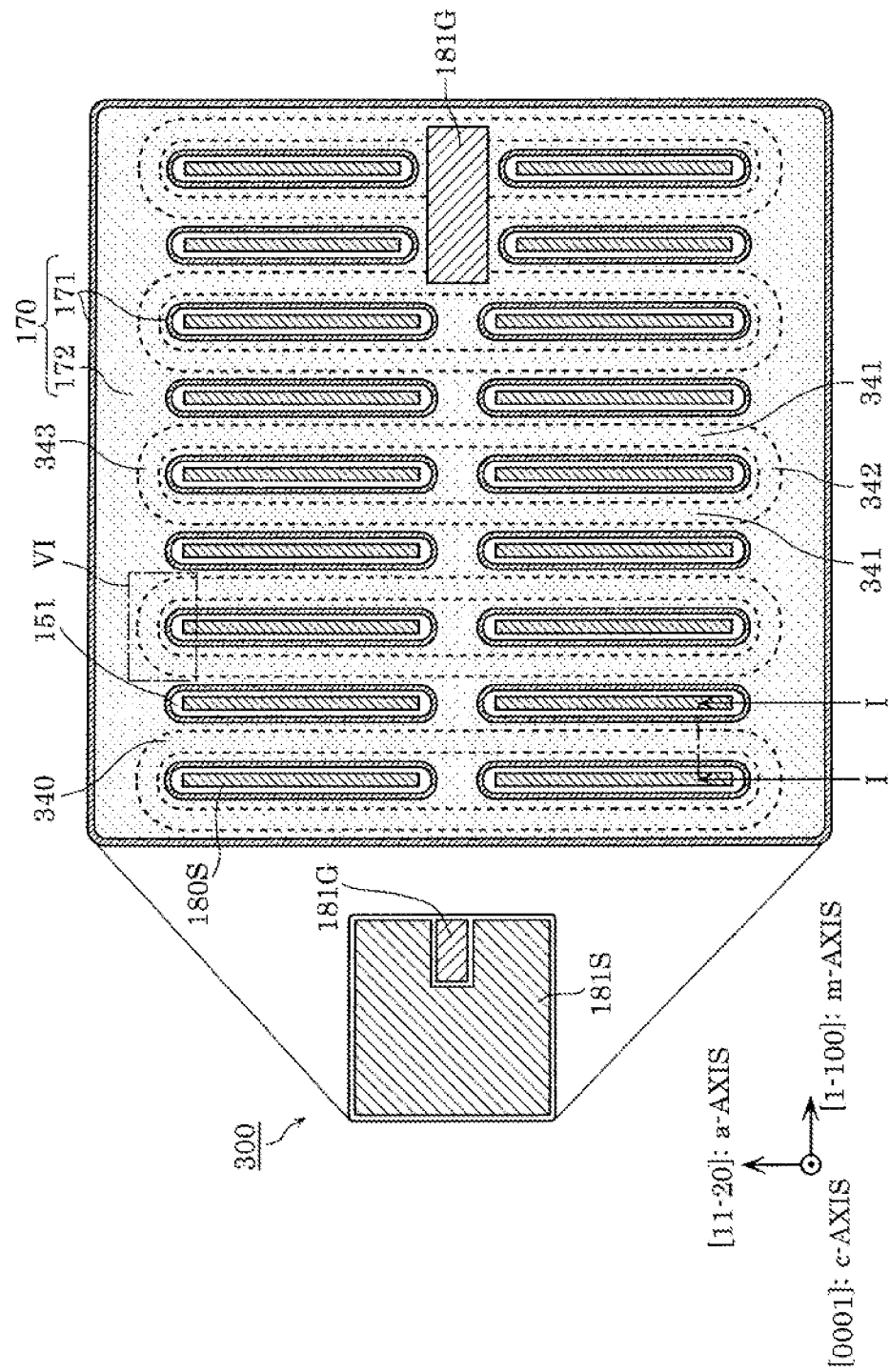
FIG. 5 is a plan view illustrating a planar layout of the nitride semiconductor device according to Embodiment 2.

FIG. 5 is a plan view illustrating a planar layout of nitride semiconductor device 300 according to the present embodiment. As in FIG. 2, FIG. 5 illustrates nitride semiconductor device 300 when source electrode pad 181S and insulating layer 190 are perspectively viewed. In nitride semiconductor device 300 according to the present embodiment, the structure of the cross-section taken along line I-I of FIG. 5 is the same as that illustrated in FIG. 1.

As illustrated in FIG. 5, unlike nitride semiconductor device 100 according to Embodiment 1, nitride semiconductor device 300 includes gate opening 340 rather than gate opening 140. Gate opening 340 is one example of the first opening penetrating through block layer 130 and reaching drift layer 120.

A single gate opening 340 has a shape of two gate openings 140 in Embodiment 1 connected at two ends on each side in the longitudinal direction. Seen in a plan view, gate opening 340 has a shape of an elongated O character or a racetrack in the a-axis direction. Specifically, as illustrated in FIG. 5, gate opening 340 includes two straight portions 341, connection portion 342, and connection portion 343.

When the first main surface is seen in a plan view, two straight portions 341 linearly extend in a predetermined direction with source electrode 180S being interposed therebetween. Specifically, two straight portions 341 are parallel to each other, and linearly extend in the a-axis direction.

Connection portion 342 is one example of a first connection portion connecting the ends of two straight portions 341. Connection portion 342 is a first end of gate opening 340. Connection portion 342 is disposed to surround one end of source electrode 180S in the longitudinal direction.

Connection portion 343 is one example of a second connection portion opposite to connection portion 342, the second connection portion connecting the ends of two straight portions 341. Connection portion 343 is a second end opposite to the first end among the two ends of gate opening 340 in the longitudinal direction. Connection portion 343 is disposed to surround the other end of source electrode 180S in the longitudinal direction.

Here, the shape of connection portion 343 as the end of gate opening 340 seen in a plan view will be described with reference to FIG. 6. The shape of connection portion 342 seen in a plan view has an inverted shape of the shape in FIG. 6 with respect to the m-axis.

Figure 6:
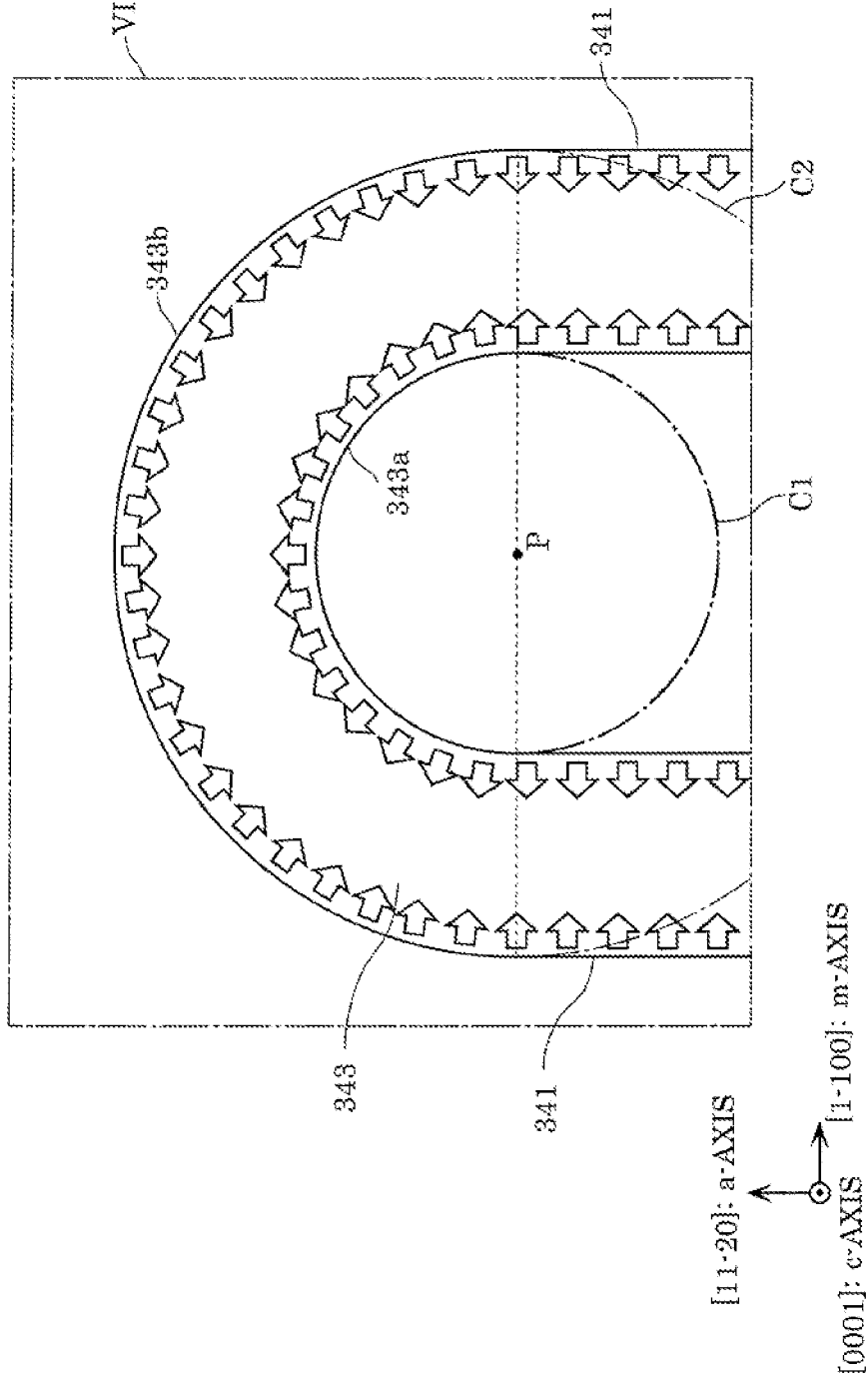
FIG. 6 is an enlarged plan view illustrating the shape of the end of the gate opening in region VI of FIG. 5.

FIG. 6 is an enlarged plan view illustrating the shape of the end of gate opening 340 in region VI of FIG. 5. As in FIG. 3, FIG. 6 illustrates only gate opening 340 in the configuration of nitride semiconductor device 300. Specifically, the outline of the bottom surface of gate opening 340 is indicated by the solid line.

Outlines 343a and 343b of connection portion 343 each at least partially follow an arc or an elliptical arc. In the present embodiment, outlines 343a and 343b each at least partially match with an arc or an elliptical arc.

Specifically, as illustrated in FIG. 6, outline 343a matches with an arc of circle C1 having point P as the center. For example, outline 343a matches with a half of the whole circumference of circle C1, namely, a half arc. For example, the diameter of circle C1 is equal to the distance between two adjacent straight portions 341.

Outline 343b matches with an arc of circle C2 having point P as the center. For example, outline 343b matches with a half of the whole circumference of circle C2, namely, a half arc. For example, the diameter of circle C2 is equal to the sum of the distance between two adjacent straight portions 341 and the widths of two straight portions 341 (namely, the length in the lateral direction). Circle C1 may have a center different from that of circle C2.

At least one of outlines 343a and 343b may be part of the outer circumference of a polygon as in the modification of Embodiment 1. Alternatively, one of outlines 343a and 343b does not need to follow an arc or an elliptical arc.

Such a configuration increases the diameters of the arcs or elliptical arcs which the outlines of connection portions 342 and 343 follow. Accordingly, as illustrated in FIG. 6, the growth direction of the regrown layer in connection portions 342 and 343 changes more smoothly than in gate opening 140 according to Embodiment 1. For this reason, the generation of singular growth points in connection portions 342 and 343 is further suppressed, thus improving the film quality of the regrown layer.

As described above, nitride semiconductor device 300 according to the present embodiment can have a further reduced leakage current and a further increased breakdown voltage.

Embodiment 3

Embodiment 3 will now be described.

In Embodiment 3, the gate opening has a shape different from that in Embodiment 2. Hereinafter, differences from Embodiment 2 will be mainly described. In the present embodiment, as in Embodiment 2, the similarities to those of Embodiment 1 will not be described in particular.

Figure 7:
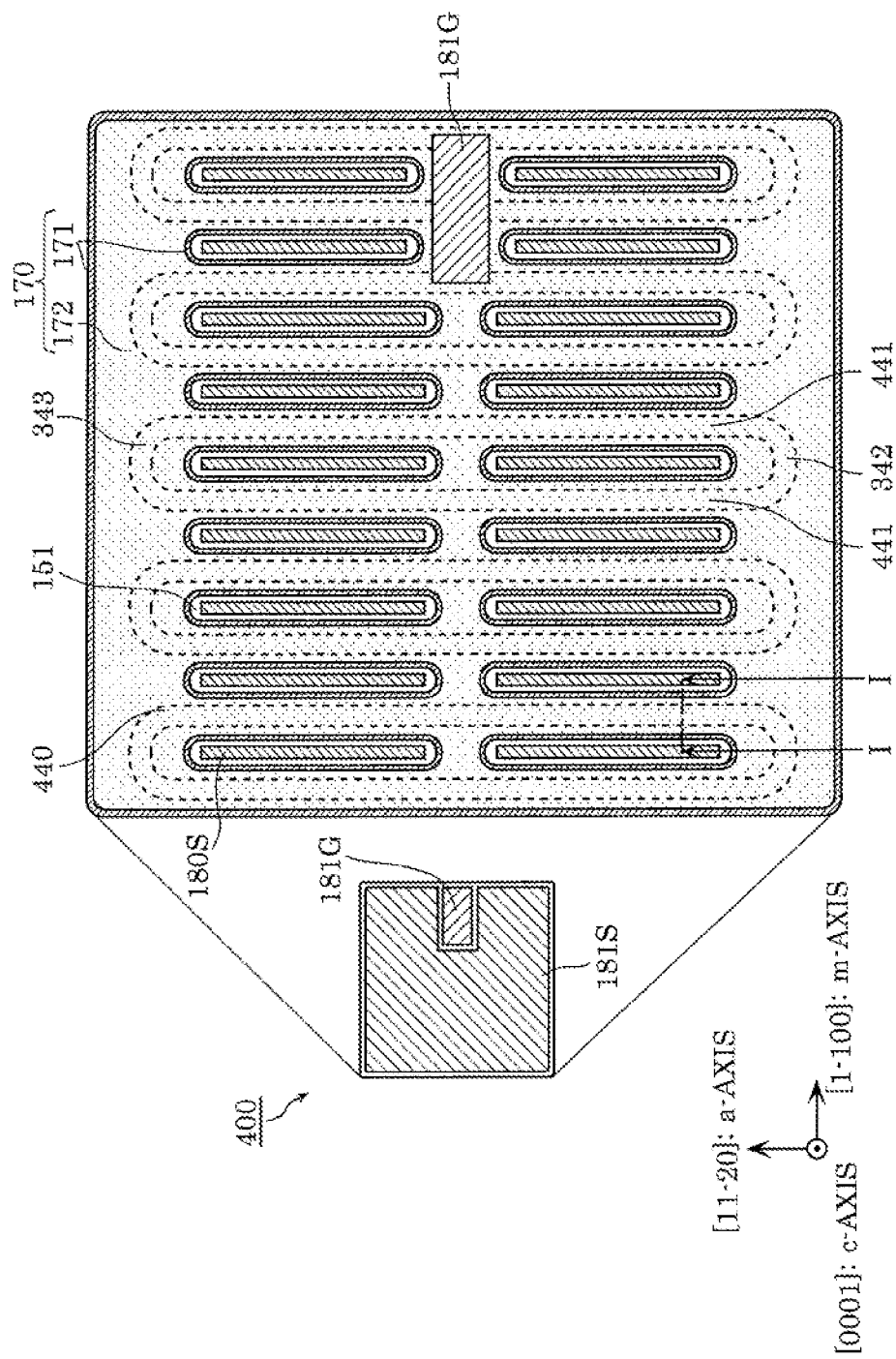
FIG. 7 is a plan view illustrating a planar layout of the nitride semiconductor device according to Embodiment 3.

FIG. 7 is a plan view illustrating a planar layout of nitride semiconductor device 400 according to the present embodiment. As in FIG. 2, FIG. 7 illustrates nitride semiconductor device 400 when source electrode pad 181S and insulating layer 190 are perspectively viewed. In nitride semiconductor device 400 according to the present embodiment, the structure of the cross-section taken along line I-I of FIG. 7 is the same as that illustrated in FIG. 1.

As illustrated in FIG. 7, unlike nitride semiconductor device 300 according to Embodiment 2, nitride semiconductor device 400 includes gate opening 440 rather than gate opening 340. Gate opening 440 is one example of the first opening penetrating through block layer 130 and reaching drift layer 120.

Seen in a plan view, gate opening 440 has a shape of an elongated O character in the a-axis direction. Specifically, gate opening 440 includes two straight portions 441, connection portion 342, and connection portion 343. As described in Embodiment 2, the outlines of connection portions 342 and 343 each at least partially follow an arc or an elliptical arc.

Two straight portions 441 linearly extend in the a-axis direction with source electrode 180S being interposed therebetween. Two straight portions 441 have a length in the a-axis direction longer than that of straight portions 341 according to Embodiment 2. Because of the increased length of two straight portions 441, the distance between source electrode 180S and connection portion 342 and that between source electrode 180S and connection portion 343 are increased.

Hereinafter, the reason for such an increased length of two straight portions 441 have will be described.

In the present embodiment, the first main surface of substrate 110 has an off angle defining an inclination of the first main surface along the a-axis direction. Specifically, the first main surface of substrate 110 is inclined to the GaN c-plane such that the level of the first main surface becomes lower along the [11-20] direction. The off angle at this time is about 0.4°, for example. In the plan view of FIG. 7, the lower portion of the drawing corresponds to the anterior side in paper and the upper portion thereof corresponds to the posterior side in paper.

Such a first main surface of substrate 110 having an off angle promotes crystal growth on the first main surface, enabling the formation of drift layer 120 having high film quality. On the other hand, the off angle may cause abnormal growth of the regrown layer formed in gate opening 440.

Figure 8:
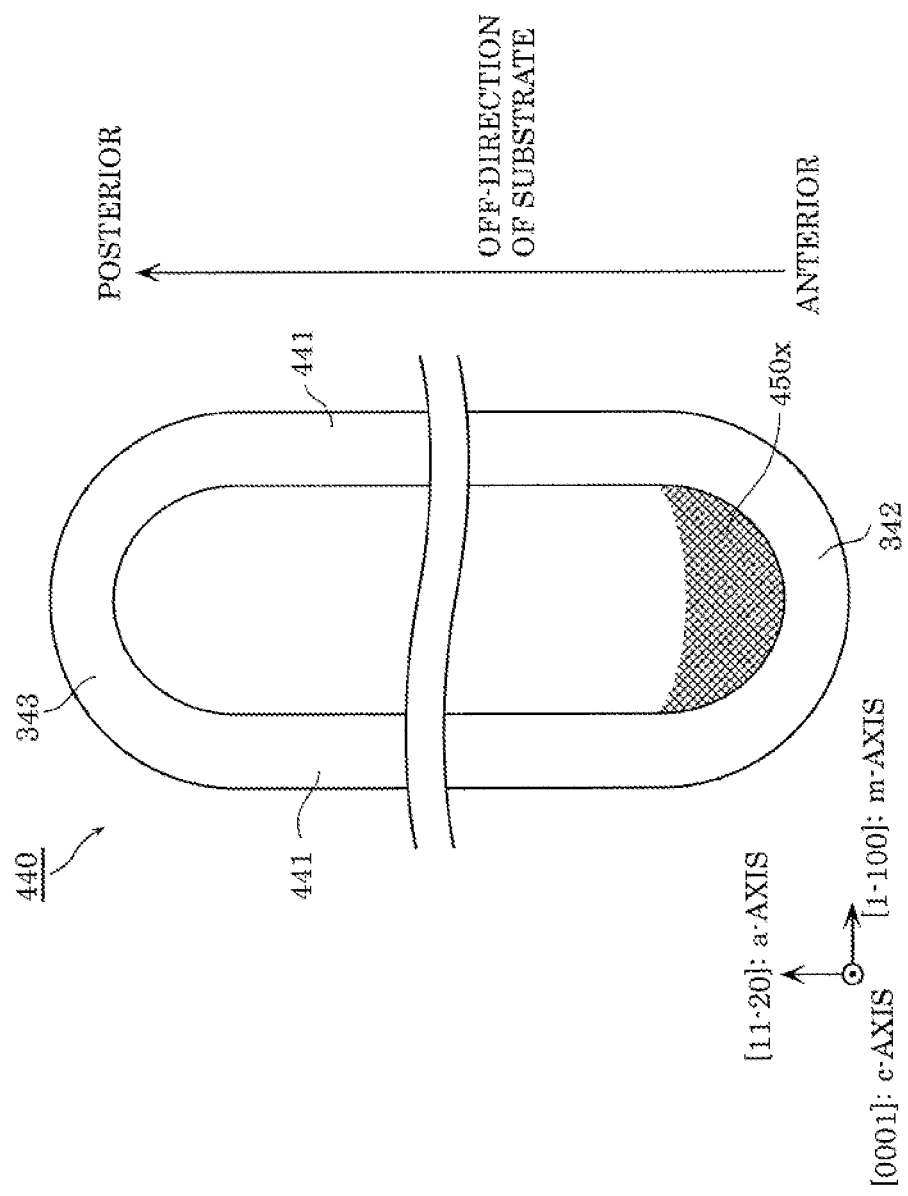
FIG. 8 is a plan view illustrating abnormal growth caused by the off angle of the substrate in the nitride semiconductor device according to Embodiment 3.

FIG. 8 is a plan view illustrating the abnormal growth caused by the off angle of substrate 110 in nitride semiconductor device 400 according to the present embodiment. FIG. 8 illustrates only gate opening 440 among the components which form nitride semiconductor device 400.

At this time, among the two ends of gate opening 340 in the longitudinal direction, connection portion 342 corresponds to the end on the anterior side of paper in FIG. 8, i.e., the end of the first main surface of substrate 110 on the raised side of the inclination defined by the off angle. Among the two ends of gate opening 340 in the longitudinal direction, connection portion 343 corresponds to the end on the posterior side of paper in FIG. 8, i.e., the end of the first main surface of substrate 110 on the lowered side of the inclination defined by the off angle.

At this time, abnormal growth of the regrown layer occurs in region 450x which is adjacent to connection portion 342 and is lower than connection portion 342 due to the off angle. In other words, region 450x is a unilateral abnormal growth region. When the off angle of substrate 110 is inclined in the opposite direction, region 450x is generated on the connection portion 343 side.

The abnormal growth generated in region 450x reduces the film thickness of the regrown layer. For this reason, if part of source electrode 180S is contained in region 450x, leakage current may be generated between gate electrode 170 and source electrode 180S.

To avoid this, in the present embodiment, seen in a plan view, a large distance between connection portion 342 and source electrode 180S is ensured such that source electrode 180S is not contained in region 450x.

Figure 9:
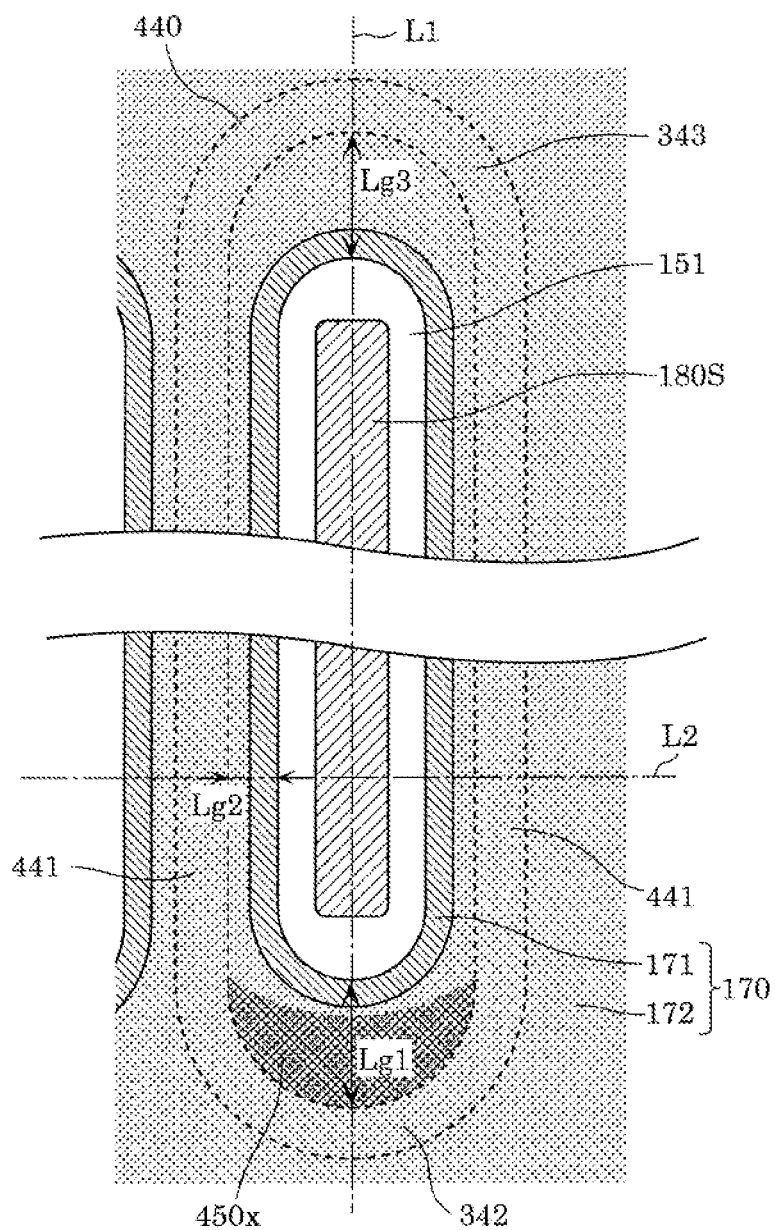
FIG. 9 is an enlarged plan view illustrating the shapes of the two ends of the gate opening according to Embodiment 3.

FIG. 9 is an enlarged plan view illustrating the shapes of the two ends of gate opening 440 according to the present embodiment. In FIG. 9, virtual straight lines L1 and L2 seen in a plan view are drawn.

Virtual straight line L1 is one example of a first virtual straight line in the longitudinal direction of source electrode 180S and gate opening 440. Specifically, virtual straight line L1 is parallel to the a-axis direction, and passes through the centers of source electrode 180S and gate opening 440 in the lateral direction.

Virtual straight line L2 is one example of a second virtual straight line orthogonal to virtual straight line L1. Virtual straight line L2 is parallel to the m-axis direction. Although different from the example illustrated in FIG. 9, virtual straight line L2 may pass through the centers of source electrode 180S and gate opening 440 in the longitudinal direction.

Distance Lg1 illustrated in FIG. 9 is one example of a first distance. Distance Lg1 is a distance on virtual straight line L1 and between the outline of connection portion 342 on the source electrode 180S side and the outline of gate electrode 170 on the source electrode 180S side. Specifically, distance Lg1 is the distance between the outline of connection portion 342 on the source electrode 180S side and the outline of threshold control layer 171 on the source electrode 180S side.

Distance Lg2 is one example of a second distance. Distance Lg2 is a distance on virtual straight line L2 and between the outline of straight portion 441 on the source electrode 180S side and the outline of gate electrode 170 on the source electrode 180S side. Specifically, distance Lg2 is the distance between the outline of straight portion 441 on the source electrode 180S side and the outline of threshold control layer 171 on the source electrode 180S side.

Distance Lg3 is one example of a third distance. Distance Lg3 is a distance on virtual straight line L1 and between the outline of connection portion 343 on the source electrode 180S side and the outline of gate electrode 170 on the source electrode 180S side. Specifically, distance Lg3 is the distance between the outline of connection portion 343 on the source electrode 180S side and the outline of threshold control layer 171 on the source electrode 180S side.

Distances Lg1 to Lg3 each indicate the distance between the outline of gate opening 440 on the source electrode 180S side and the outline of gate electrode 170 (specifically, threshold control layer 171) on the source electrode 180S side. In a cross-sectional view, distances Lg1 to Lg3 correspond to distance Lg illustrated in FIG. 1.

In the present embodiment, distance Lg1 is longer than distance Lg2. Furthermore, distance Lg3 is less than or equal to distance Lg1. Specifically, distance Lg3 is equal to distance Lg1. Namely, the relation represented by an expression Lg2<Lg1=Lg3 is satisfied.

Distance Lg1 and distance Lg3 having an equal length results in a symmetric planar layout of nitride semiconductor device 400 as illustrated in FIG. 7. Specifically, seen in a plan view, nitride semiconductor device 400 has a line symmetric planar layout with respect to the symmetric axis which is a line which is parallel to the m-axis and passes through the center of nitride semiconductor device 400.

Here, as illustrated in FIG. 9, distance Lg1 is longer than the length of region 450x on virtual straight line L1, where abnormal growth may occur, for example. Such a configuration suppresses projection of region 450x, where abnormal growth may occur due to the off angle, from under gate electrode 170 to the source electrode 180S side. In other words, seen in a plan view, a regrown layer without abnormal growth caused by the off angle is formed in a region under gate electrode 170 which is closest to source electrode 180S. For this reason, the channel is appropriately controlled by gate electrode 170 to suppress the leakage current.

As described above, nitride semiconductor device 400 according to the present embodiment can have a low leakage current and a high breakdown voltage.

Embodiment 4

Embodiment 4 will now be described.

In Embodiment 4, the gate opening has a shape different from that in Embodiment 3. Hereinafter, differences from Embodiment 3 will be mainly described. In the present embodiment, as in Embodiment 3, the similarities to those of Embodiment 1 will not be described in particular.

Figure 10:
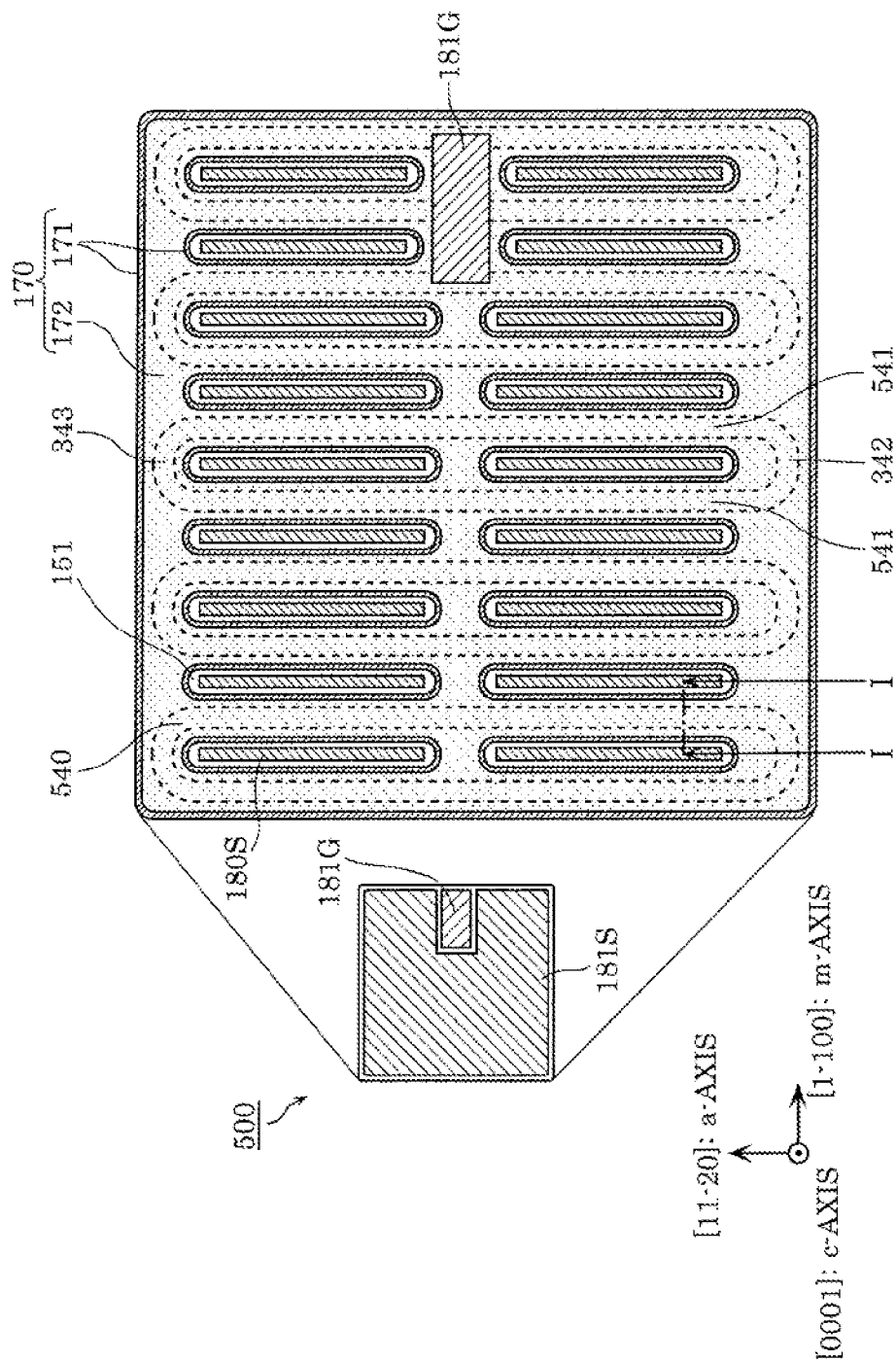
FIG. 10 is a plan view illustrating a planar layout of the nitride semiconductor device according to Embodiment 4.

FIG. 10 is a plan view illustrating a planar layout of nitride semiconductor device 500 according to the present embodiment. As in FIG. 7, FIG. 10 illustrates nitride semiconductor device 500 when source electrode pad 181S and insulating layer 190 are perspectively viewed. In nitride semiconductor device 500 according to the present embodiment, the structure of the cross-section taken along line I-I of FIG. 10 is the same as that illustrated in FIG. 1.

As illustrated in FIG. 10, unlike nitride semiconductor device 400 according to Embodiment 3, nitride semiconductor device 500 includes gate opening 540 rather than gate opening 440. Gate opening 540 is one example of the first opening penetrating through block layer 130 and reaching drift layer 120.

Seen in a plan view, gate opening 540 has a shape of an elongated O character in the a-axis direction. Specifically, gate opening 540 includes two straight portions 541, connection portion 342, and connection portion 343. As described in Embodiment 2, the outlines of connection portions 342 and 343 each at least partially follow an arc or an elliptical arc.

Two straight portions 541 linearly extend in the a-axis direction with source electrode 180S being interposed therebetween. The length of two straight portions 541 in the a-axis direction is longer than that of straight portions 341 according to Embodiment 2 and shorter than that of straight portions 441 according to Embodiment 3. In the present embodiment, such an increased length of two straight portions 541 results in an increase in distance between connection portion 342 and source electrode 180S.

Figure 11:
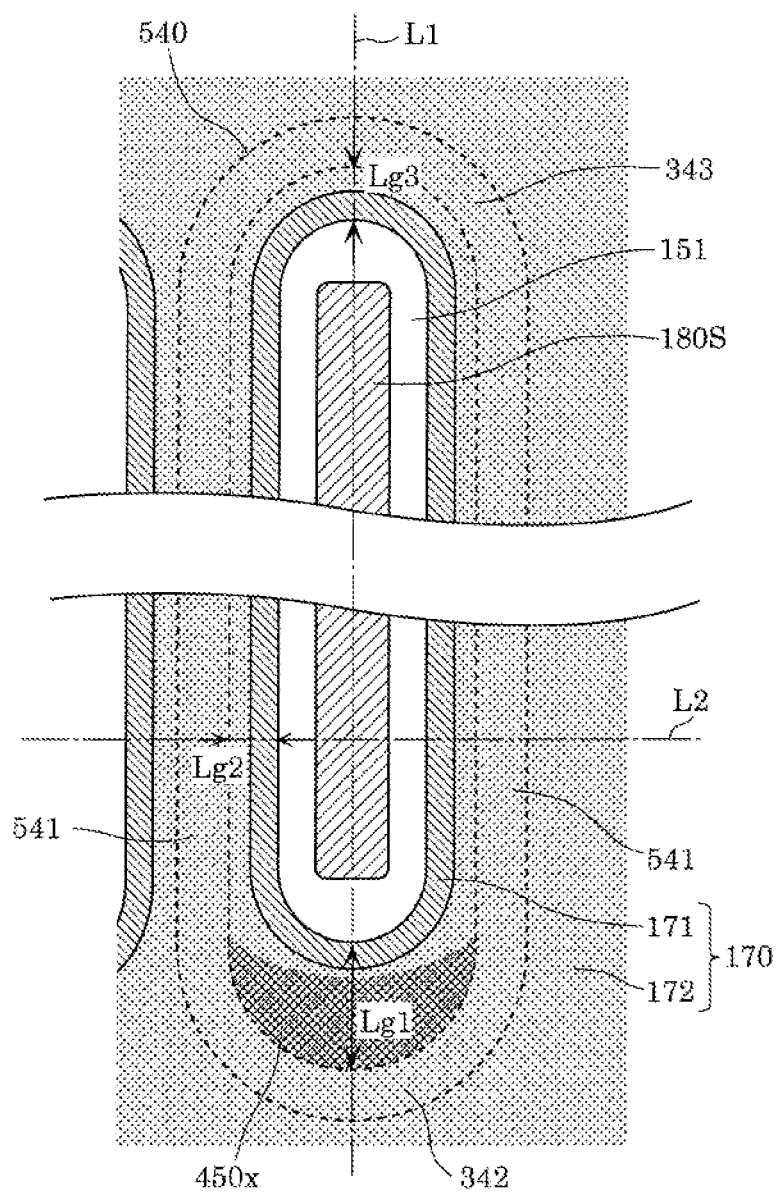
FIG. 11 is an enlarged plan view illustrating the shapes of the two ends of the gate opening according to Embodiment 4.

FIG. 11 is an enlarged plan view illustrating the shape of the two ends of gate opening 540 according to the present embodiment. In FIG. 11, virtual straight lines L1 and L2 are drawn seen in a plan view. Virtual straight lines L1 and L2 illustrated in FIG. 11 and distances Lg1 to Lg3 are as described in Embodiment 3.

As described with reference to FIG. 8, here, region 450x with abnormal growth is generated only on the connection portion 342 side, but not on the connection portion 343 side.

For this reason, distance Lg3 on the connection portion 343 side does not need to be increased.

In the present embodiment, distance Lg3 is equal to distance Lg2. In such a configuration, an unnecessary space can be reduced in the planar layout of nitride semiconductor device 500, thus reducing the size of nitride semiconductor device 500.

As in Embodiment 3, seen in a plan view of nitride semiconductor device 500 according to the present embodiment, the regrown layer without the abnormal growth caused by the off angle is formed in a region under gate electrode 170 which is closest to source electrode 180S. For this reason, the channel is appropriately controlled by gate electrode 170 to suppress the leakage current.

Other Embodiments

Although the nitride semiconductor devices according to one or more aspects have been described above based on the embodiments, these embodiments should not be construed as limitations to the present disclosure. A variety of modifications of the present embodiments made by a person skilled in the art without departing from the gist of the present disclosure and embodiments including combinations of components in different embodiments are also included in the scope of the present disclosure.

For example, although the examples in which the first conductivity type is the n, $n^+$, or $n^-$ type and the second conductivity type is the p, $p^+$, or $p^-$ type have been described in the embodiments above, the conductivity types are not limited to this. The first conductivity type may be the p, $p^+$, or $p^-$ type and the second conductivity type may be the n, $n^+$, or $n^-$ type.

For example, in the embodiments, the nitride semiconductor devices do not need to include threshold control layer 171. In other words, the gate electrode may include only the metal film.

For example, although the examples where the shape of the first opening seen in a plan view has a shape of an O character or a racetrack have been described in Embodiments 2 to 4, the first opening can have any other shape, such as a shape of a U character. In other words, the first opening does not need to include the second connection portion. In this case, the outlines of the ends not connected to the two straight portions each may follow an arc or an elliptical arc as in Embodiment 1 or its modification.

For example, in the embodiments, the outlines of the two ends of the first opening may have different shapes. Specifically, the outline of one end of the first opening may have an arc shape, and the outline of the other end thereof may have a regular N-gon. For example, only the outline of one end of the first opening may follow an arc or an elliptical arc.

For example, although the examples in which the longitudinal direction of the gate opening is the a-axis direction of GaN have been described in the embodiments, the longitudinal direction may be any other direction. For example, the longitudinal direction of the gate opening may be the m-axis direction.

The embodiments above can be subjected to alteration, replacement, addition, and omission in various ways within the scope or its equivalent scope.

INDUSTRIAL APPLICABILITY

The present disclosure can be used as a nitride semiconductor device having a low leakage current and a high breakdown voltage, and can be used as a power device used in power supply circuits for consumer products such as television sets.

The invention claimed is:

1. A nitride semiconductor device, comprising:
    a substrate having a first main surface and a second main surface on a reverse side of the first main surface;
    a first nitride semiconductor layer of a first conductivity type above the first main surface;
    a block layer above the first nitride semiconductor layer;
    a first opening penetrating through the block layer and reaching the first nitride semiconductor layer;
    an electron transit layer and an electron supply layer provided sequentially above the block layer and along an inner surface of the first opening, the electron transit layer being closer to the substrate than the electron supply layer;
    a gate electrode provided above the electron supply layer to cover the first opening;
    a second opening in a location away from the gate electrode, the second opening penetrating through the electron supply layer and the electron transit layer and reaching the block layer;
    a source electrode provided in the second opening and connected to the block layer; and
    a drain electrode on a second main surface-side of the substrate,
    wherein when the first main surface is seen in a plan view,
    (i) the first opening and the source electrode extend in a same, longitudinal direction and are longer in the longitudinal direction than in a lateral direction perpendicular to the longitudinal direction, and
    (ii) the first opening includes:
        two straight portions linearly extending in the longitudinal direction with the source electrode being interposed between the two straight portions, and
        a first connection portion which connects ends of the two straight portions.

2. The nitride semiconductor device according to claim 1, wherein the first main surface has an off angle defining an inclination of the first main surface along the longitudinal direction.

3. The nitride semiconductor device according to claim 2, wherein the first connection portion is located at an end of the first opening in the longitudinal direction on a raised side of the inclination defined by the off angle of the first main surface,
    when the first main surface is seen in the plan view,
    (a) the gate electrode surrounds the source electrode,
    (b) a first distance is a straight distance in the longitudinal direction and between an outline of an outermost region of the first connection portion on a source electrode side and an outline of an outermost region of the gate electrode on the source electrode side,
    (c) a second distance is a straight distance orthogonal to the first virtual straight line the longitudinal direction and between an outline of one of the two straight portions on the source electrode side and the outline of an outermost region of the gate electrode on the source electrode side, and
    the first distance is longer than the second distance.

4. The nitride semiconductor device according to claim 3, wherein the first opening further includes a second connection portion opposite to the first connection portion, the second connection portion connecting the other ends of the two straight portions, and
    at least part of an outline of the second connection portion is an arc or an elliptical arc.

5. The nitride semiconductor device according to claim 4, wherein a third distance is less than or equal to the first distance, the third distance being a straight distance between an outline of an outermost region of the second connection portion on the source electrode side and the outline of the outermost region of the gate electrode on the source electrode side.

6. The nitride semiconductor device according to claim 5, wherein the third distance is equal to the second distance.

7. The nitride semiconductor device according to claim 1, wherein the gate electrode includes:
    a metal film; and
    a semiconductor layer of a second conductivity type sandwiched between the metal film and the electron supply layer, the second conductivity type having a polarity different from a polarity of the first conductivity type.

8. The nitride semiconductor device according to claim 1, wherein the nitride semiconductor device includes the source electrode including two or more source electrodes and the first opening including two or more first openings, and
    portions of the two or more first openings extending in the longitudinal direction and the two or more source electrodes are alternately aligned in a direction intersecting perpendicular to the longitudinal direction.

9. The nitride semiconductor device according to claim 1, wherein at least part of an outline of an outermost portion of the first connection portion of the first opening in the longitudinal direction is an arc or an elliptical arc.

10. The nitride semiconductor device according to claim 1, wherein at least part of an outline of an outermost portion of the first connection portion of the first opening in the longitudinal direction is part of a polygon which has vertices, with interior vertex angles at all of the vertices being greater than 120°.

11. The nitride semiconductor device according to claim 1, wherein the block layer includes a second nitride semiconductor layer of a second conductivity type having a polarity different from a polarity of the first conductivity type.

* * * * *